(12) United States Patent
Huang et al.

(10) Patent No.: US 9,975,754 B2
(45) Date of Patent: May 22, 2018

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Fu-Chun Huang, Hsinchu County (TW); Li-Chen Yen, Hsinchu County (TW); Tzu-Heng Wu, New Taipei (TW); Yi-Heng Tsai, Hsinchu (TW); Chun-Ren Cheng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days. days.

(21) Appl. No.: 15/498,009

(22) Filed: Apr. 26, 2017

(65) Prior Publication Data
US 2017/0297901 A1   Oct. 19, 2017

Related U.S. Application Data

(62) Division of application No. 15/055,072, filed on Feb. 26, 2016, now Pat. No. 9,656,855.

(51) Int. Cl.
*B81C 1/00* (2006.01)
*B81B 3/00* (2006.01)

(52) U.S. Cl.
CPC ........ *B81B 3/0086* (2013.01); *B81C 1/00246* (2013.01); *B81B 2207/015* (2013.01); *B81B 2207/07* (2013.01); *B81C 2201/0132* (2013.01); *B81C 2201/0181* (2013.01); *B81C 2203/035* (2013.01)

(58) Field of Classification Search
CPC ........ B81C 2201/0181; B81C 1/00246; B81B 3/0086
See application file for complete search history.

(56) References Cited

U.S. PATENT DOCUMENTS

2017/0260042 A1*   9/2017   Liu .................. B81B 7/0006

* cited by examiner

*Primary Examiner* — Tran Tran
(74) *Attorney, Agent, or Firm* — WPAT, P.C., Intellectual Property Attorneys; Anthony King

(57) ABSTRACT

A method of manufacturing a semiconductor structure includes receiving a first substrate including a dielectric layer disposed over the first substrate; forming a sensing structure and a bonding structure over the dielectric layer; disposing a conductive layer on the sensing structure; disposing a barrier layer over the dielectric layer; removing a first portion of the barrier layer to at least partially expose the conductive layer on the sensing structure; and removing a second portion of the barrier layer to at least partially expose the bonding structure.

20 Claims, 11 Drawing Sheets

SEMICONDUCTOR STRUCTURE AND MANUFACTURING METHOD THEREOF

PRIORITY CLAIM AND CROSS-REFERENCE

This application claims priority to U.S. application Ser. No. 15/055,072 filed on Feb. 26, 2016, entitled "Semiconductor Structure and Manufacturing Method Thereof," which application is hereby incorporated herein by reference.

BACKGROUND

Electronic equipment involving semiconductive devices is essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. A MEMS device is a micro-sized device, usually in a range from less than 1 micron to several millimeters in size. The MEMS device includes fabrication using semiconductive materials to form mechanical and electrical features. The MEMS device becomes increasingly complex and includes a number of elements (e.g., stationary or movable elements) for achieving electro-mechanical functionality. MEMS devices are widely used in various applications. MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications are extended to optical applications, such as movable mirrors, and radio frequency (RF) applications, such as RF switches or the like.

As technologies evolve, design of the devices becomes more complicated in view of small dimension as a whole and increase of functionality and amounts of circuitries. The devices involve many complicated steps and increased complexity of manufacturing. The increase in complexity of manufacturing may cause deficiencies such as high yield loss, warpage, and low signal to noise ratio (SNR). Therefore, there is a continuous need to modify structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
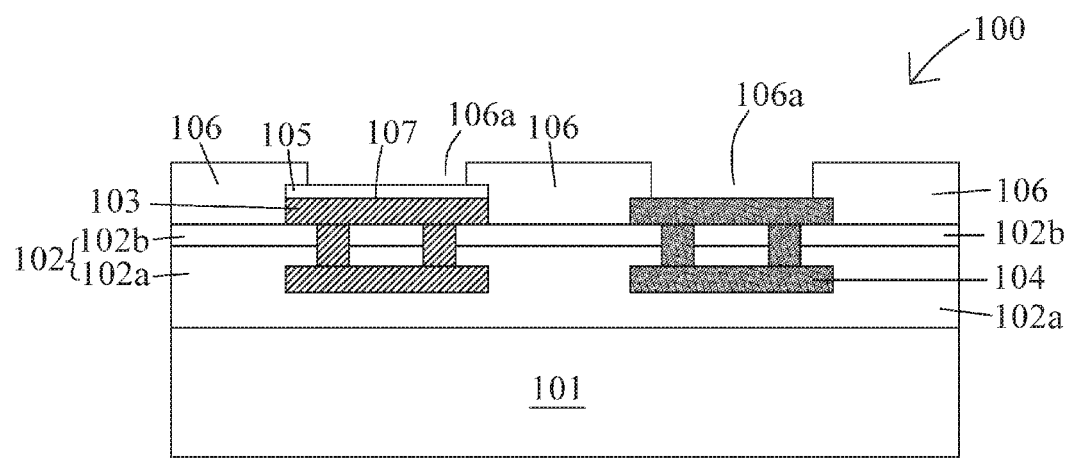
FIG. 1 is a schematic cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure involves various kinds of elements and is manufactured by a number of operations. Upon fabrication of the semiconductor structure involving a MEMS device, the MEMS device is coupled with and supported by a substrate. Moreover, some portions of a sacrificial layer in the MEMS device are removed to configure a particular region of the MEMS device for a predetermined sensing purpose such gas, motion or gravitational detection. During the removal of the sacrificial layer, a masking material is disposed over the rest of elements of the semiconductor structure in order to protect them from being removed. The sacrificial layer is removed by wet etching or vapor etching operations. An etchant is used to etch away the sacrificial layer, while those elements covered by the masking material would not be removed.

However, some undesired materials may be formed over the masking material after the etching operations. Such undesired material is non-conductive and thus would easily accumulate static electric charges thereon. The presence of such non-conductive undesired material over the elements of the semiconductor structure would induce a charging effect and thus would affect sensitivity or even cause failure of the semiconductor structure. For example, sensitivity of a sensing electrode in the semiconductor structure would be reduced if the non-conductive undesired material is disposed over the sensing electrode. Consequently, reliability and performance of the semiconductor structure would be adversely affected.

In the present disclosure, a semiconductor structure with an improvement is disclosed. The semiconductor structure includes a substrate, a dielectric layer over the substrate, a sensing structure over or within the dielectric layer, and a conductive layer covering the sensing structure. The conductive layer can protect the sensing structure from being damaged during subsequent operations. Further, the conductive layer can prevent the sensing structure from being removed during or after etching operations. Also, non-conductive material would not be formed over the conductive layer upon the etching operations. Since the non-conductive material would not be formed over the sensing structure, no charging effect would be induced. As such, the sensitivity and reliability of the semiconductor structure would be improved.

FIG. 1 is a schematic cross-sectional view of a semiconductor structure 100 in accordance with some embodiments of the present disclosure. Referring to FIG. 1, the semiconductor structure 100 includes a substrate 101, a dielectric layer 102, a sensing structure 103, a bonding structure 104, a conductive layer 105 and a barrier layer 106. In some embodiments, the semiconductor structure 100 is configured to detect proximity, position, displacement, acceleration or the like based on capacitive coupling. In some embodiments, the semiconductor structure 100 is a part of a capacitive sensor. In some embodiments, the semiconductor structure 100 generates an electrical signal in response to the detection.

In some embodiments, the semiconductor structure 100 includes the substrate 101. In some embodiments, the substrate 101 is a semiconductive substrate fabricated with a predetermined functional circuit over the substrate 101. In some embodiments, the substrate 101 is fabricated for a predetermined application. In some embodiments, the substrate 101 includes several conductive lines and several electrical components such as transistor, diode, etc. connected by the conductive lines. In some embodiments, the substrate 101 is a silicon substrate. In some embodiments, the substrate 101 is a complementary metal oxide semiconductor (CMOS) substrate which includes several CMOS components and CMOS circuitries thereon. In some embodiments, the substrate 101 includes semiconductive material such as silicon, germanium, gallium, arsenic, or combinations thereof. In some embodiments, a cross sectional area of the substrate 101 is in a quadrilateral, rectangular, square, polygonal or any other suitable shapes.

In some embodiments, the semiconductor structure 100 includes the dielectric layer 102 disposed over the substrate 101. In some embodiments, the dielectric layer 102 is disposed over an active surface of the substrate 101. In some embodiments, the dielectric layer 102 includes dielectric material such as oxide, nitride, silicon oxide, silicon nitride, silicon carbide, silicon oxynitride, polyimide (PI), benzocyclobutene (BCB), polybenzoxazole (PBO) or the like. In some embodiments, the dielectric layer 102 includes several layers of dielectric material disposed or stacked over each other. In some embodiments, the dielectric layer 102 is an interlayer dielectric (ILD). In the present embodiment, the dielectric layer 102 includes a first layer 102a and a second layer 102b over the first layer 102a. In some embodiments, the first layer 102a includes oxide, and the second layer 102b includes nitride. In some embodiments, the first layer 102a includes silicon oxide, and the second layer 102b includes silicon nitride.

In some embodiments, the semiconductor structure 100 includes the sensing structure 103 disposed over or within the dielectric layer 102. In some embodiments, the sensing structure 103 is conductive or includes conductive material such as aluminum, copper, gold or etc. In some embodiments, the sensing structure 103 includes aluminum copper (AlCu) alloy. In some embodiments, the sensing structure 103 is configured for sensation or detection. In some embodiments, the sensing structure 103 is a sensing electrode.

In some embodiments, the sensing structure 103 is partially disposed within or surrounded by the dielectric layer 102. In some embodiments, a portion of the sensing structure 103 passes through the second layer 102b and a portion of the first layer 102a. In some embodiments, the sensing structure 103 is partially disposed over the dielectric layer 102. In some embodiments, a portion of the sensing structure 103 is disposed over the second layer 102b of the dielectric layer 102.

In some embodiments, the semiconductor structure 100 includes the bonding structure 104 disposed over or within the dielectric layer 102. In some embodiments, the bonding structure 104 is conductive or includes conductive material such as aluminum, copper, gold or etc. In some embodiments, the bonding structure 104 includes aluminum copper (AlCu) alloy. In some embodiments, the bonding structure 104 is configured to receive or bond with a conductive structure.

In some embodiments, the bonding structure 104 is partially disposed within or surrounded by the dielectric layer 102. In some embodiments, a portion of the bonding structure 104 passes through the second layer 102b and a portion of the first layer 102a. In some embodiments, the bonding structure 104 is partially disposed over the dielectric layer 102. In some embodiments, a portion of the bonding structure 104 is disposed over the second layer 102b of the dielectric layer 102.

In some embodiments, the conductive layer 105 is disposed over the sensing structure 103. In some embodiments, the conductive layer 105 covers the sensing structure 103. In some embodiments, the conductive layer 105 is disposed or coated on the sensing structure 103 disposed over the dielectric layer 102. In some embodiments, there is an interface 107 between the sensing structure 103 and the conductive layer 105. In some embodiments, the conductive layer 105 is configured to protect the sensing structure 103.

In some embodiments, the conductive layer 105 includes conductive material. In some embodiments, the conductive layer 105 includes titanium tungsten (TiW), platinum (Pt) or gold (Au). In some embodiments, the conductive layer 105 is resistant to a predetermined etchant such as hydrofluoric (HF) acid vapor or the like. In some embodiments, the conductive layer 105 has a thickness of greater than about 0.02 um. In some embodiments, the thickness of the conductive layer 105 is greater than about 0.01 um.

In some embodiments, the barrier layer 106 is disposed over the dielectric layer 102 and the conductive layer 105. In some embodiments, a portion of the conductive layer 105 on the sensing structure 103 is exposed from the barrier layer 106. In some embodiments, a portion of the conductive layer 105 is covered by the barrier layer 106. In some embodiments, the conductive layer 105 is at least partially exposed from the barrier layer 106. In some embodiments, the barrier layer 106 surrounds the conductive layer 105 and the sensing structure 103 disposed over the dielectric layer 102.

In some embodiments, the sensing structure 103 covered by the conductive layer 105 is prevented from being removed. In some embodiments, a non-conductive material, a dielectric material or an insulating material disposed on the conductive layer 105 exposed from the barrier layer 106 is absent. It is undesirable that the non-conductive material is disposed on or over the conductive layer 105 exposed from the barrier layer 106. The disposition of the non-conductive material on or over the conductive layer 105 exposed from the barrier layer 106 would induce a charging effect, which would affect the sensitivity of the sensing structure 103 or performance of the semiconductor structure 100. Since there is no non-conductive material disposed over the sensing structure 103, the charging effect would not be induced and thus the sensitivity of the sensing structure 103 would not be affected.

In some embodiments, the barrier layer 106 includes a recess 106a extending towards the sensing structure 103. In some embodiments, the recess 106a exposes a portion of the conductive layer 105 disposed on the sensing structure 103. In some embodiments, the recess 106a extends from a top surface of the barrier layer 106 to the conductive layer 105.

In some embodiments, the barrier layer 106 includes oxide, carbide, aluminum oxide, alumina, silicon carbide or the like. In some embodiments, the barrier layer 106 is resistant to a predetermined material such as hydrofluoric (HF) acid vapor or the like. In some embodiments, the barrier layer 106 is resistant to a predetermined etchant. In some embodiments, the barrier layer 106 has a thickness of greater than about 0.02 um. In some embodiments, the thickness of the barrier layer 106 is greater than about 0.01 um.

Figure 2:
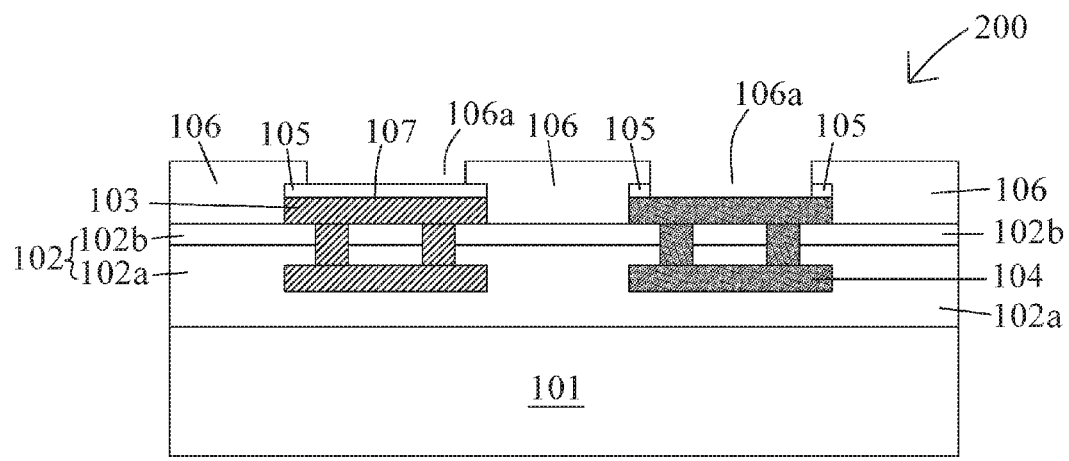
FIG. 2 is a schematic cross-sectional view of a semiconductor structure in accordance with some embodiments of the present disclosure.

FIG. 2 is a schematic cross-sectional view of a semiconductor structure 200 in accordance with some embodiments of the present disclosure. Referring to FIG. 2, the semiconductor structure 200 includes a substrate 101, a dielectric layer 102, a sensing structure 103, a bonding structure 104 and a barrier layer 106, which have similar configurations as described above or illustrated in FIG. 1.

In some embodiments, the conductive layer 105 is disposed over the sensing structure 105 and the bonding structure 104 respectively. In some embodiments, the conductive layer 105 is disposed on the sensing structure 105 as described above or illustrated in FIG. 1. In some embodiments, the conductive layer 105 partially covers the bonding structure 104 disposed over the dielectric layer 102 as shown in FIG. 2. In some embodiments, the conductive layer 105 is peripherally disposed on the bonding structure 104. In some embodiments, a portion of the bonding structure 104 is exposed from the conductive layer 105. In some embodiments, the portion of the bonding structure 104 exposed from the conductive layer 105 is configured to receive or bond with a conductive structure.

In some embodiments, the conductive layer 105 includes conductive material. In some embodiments, the conductive layer 105 includes titanium tungsten (TiW), platinum (Pt) or gold (Au). In some embodiments, the conductive layer 105 is resistant to a predetermined etchant such as hydrofluoric (HF) acid vapor or the like. In some embodiments, the conductive layer 105 has a thickness of greater than about 0.02 um. In some embodiments, the thickness of the conductive layer 105 is greater than about 0.01 um.

In some embodiments, the barrier layer 106 covers the conductive layer 105 disposed on the bonding structure 104. In some embodiments, a portion of the bonding structure 104 is exposed from the conductive layer 105 and the barrier layer 106. In some embodiments, the bonding structure 104 is at least partially exposed from the barrier layer 106. In some embodiments, the bonding structure 104 exposed from the barrier layer 106 is configured to receive or bond with a conductive structure. In some embodiments, the bonding structure 104 disposed over the dielectric layer 102 is surrounded by the barrier layer 106.

In some embodiments, the barrier layer 106 includes a recess 106a extending to the bonding structure 104. In some embodiments, the recess 106a exposes a portion of the bonding structure 104, such that the portion of the bonding structure 104 can receive or bond with a conductive structure. In some embodiments, the recess 106a extends from a top surface of the barrier layer 106 to the bonding structure 104.

Figure 3:
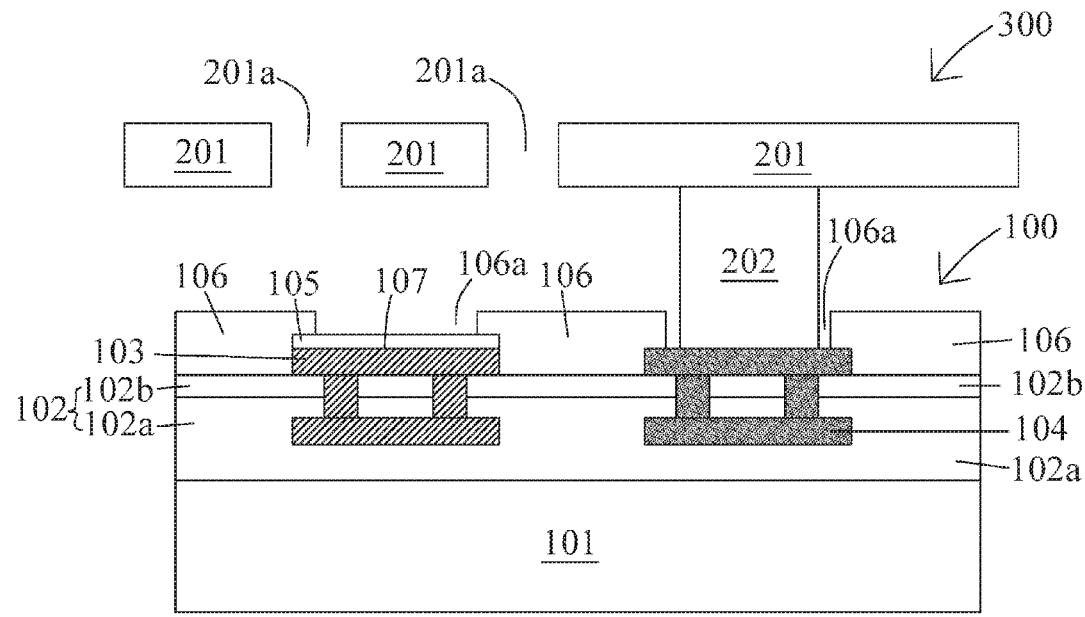
FIG. 3 is a schematic cross-sectional view of a semiconductor structure in accordance with some embodiments of the present disclosure.

FIG. 3 is a schematic cross-sectional view of a semiconductor structure in accordance with some embodiments of the present disclosure. Referring to FIG. 3, the semiconductor structure is configured to detect proximity, position, displacement, acceleration or the like based on capacitive coupling. In some embodiments, the semiconductor structure is a part of a capacitive sensor. In some embodiments, the semiconductor structure generates an electrical signal in response to the detection.

In some embodiments, the semiconductor structure includes a first semiconductor structure 100 and a third semiconductor structure 300. In some embodiments, the first semiconductor structure 100 is integrated with the third semiconductor structure 300. In some embodiments, the third semiconductor structure 300 is disposed over the first semiconductor structure 100. In some embodiments, the third semiconductor structure 300 is disposed opposite to the barrier layer 106 of the first semiconductor structure 100. In some embodiments, the first semiconductor structure 100 has a similar configuration as described above or as illustrated in FIG. 1.

In some embodiments, the third semiconductor structure 300 includes a substrate 201 and a conductive plug 202. In some embodiments, the substrate 201 includes electromechanical elements or MEMS components disposed over the substrate 201. In some embodiments, the substrate 201 is a MEMS substrate. In some embodiments, the substrate 201 includes semiconductive material such as silicon or the like.

In some embodiments, the substrate 201 is disposed opposite to the barrier layer 106 of the first semiconductor structure 100. In some embodiments, the substrate 201 is perforated for sensing purpose. In some embodiments, the substrate 201 includes an aperture 201a passing through the substrate 201. In some embodiments, the aperture 201a is configured to facilitate a sensation by the sensing structure 103. In some embodiments, the aperture 201a is disposed adjacent to the sensing structure 103. In some embodiments, a portion of the conductive layer 105 is exposed to facilitate the sensation.

In some embodiments, the conductive plug 202 is disposed over and protruded from the substrate 201. In some embodiments, the conductive plug 202 is electrically connected with the substrate 201. In some embodiments, the conductive plug 202 includes conductive or semiconductive material. In some embodiments, the conductive plug 202 includes polysilicon.

In some embodiments, the conductive plug 202 is disposed over or bonded with the bonding structure 104, such that the first semiconductor structure 100 is electrically connected with the third semiconductor structure 300. In some embodiments, the substrate 201 is electrically connected with the substrate 101 through the conductive plug 202 and the bonding structure 104. In some embodiments, the conductive plug 202 is disposed within the recess 106a over the bonding structure 104. In some embodiments, a portion of the conductive plug 202 is surrounded by the barrier layer 106. In some embodiments, a conductive material such as germanium, gold or the like is disposed between the bonding structure 104 and the conductive plug 103 in order to facilitate bonding of the conductive plug 103 with the bonding structure 104.

Figure 4:
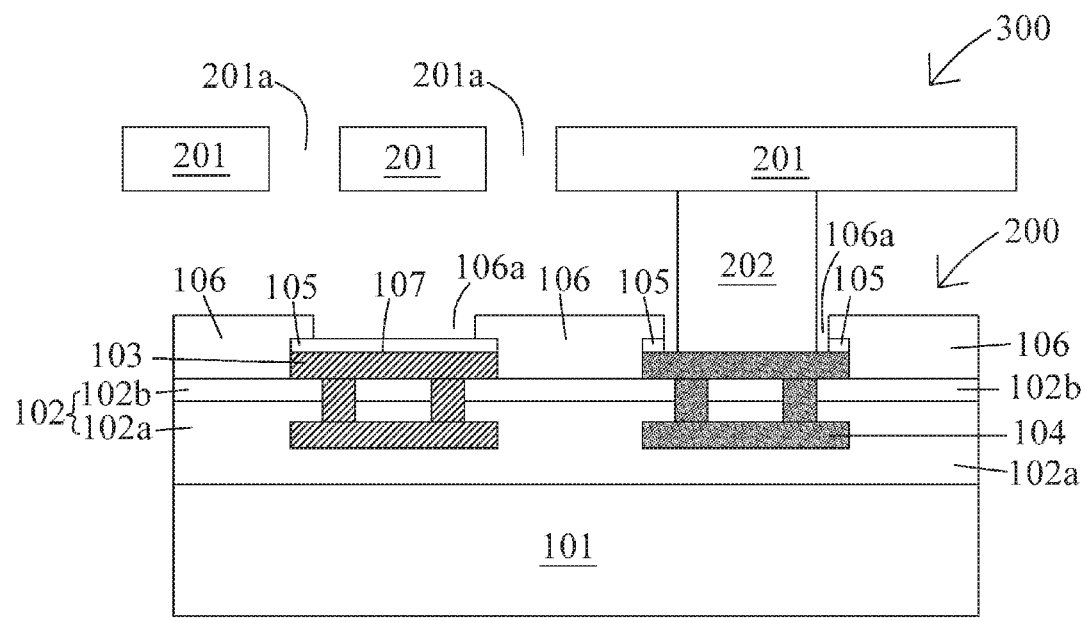
FIG. 4 is a schematic cross-sectional view of a semiconductor structure in accordance with some embodiments of the present disclosure.

FIG. 4 is a schematic cross-sectional view of a semiconductor structure in accordance with some embodiments of the present disclosure. Referring to FIG. 4, the semiconductor structure includes a second semiconductor structure 200 and a third semiconductor structure 300. In some embodiments, the second semiconductor structure 200 has a similar configuration as described above or as illustrated in FIG. 2. In some embodiments, the third semiconductor structure 300 has similar configuration as described above or illustrated in FIG. 3. In some embodiments, the second semiconductor structure 200 is integrated with the third semiconductor structure 300. In some embodiments, the third semiconductor structure 300 is disposed over the second semiconductor structure 200. In some embodiments, the third semiconductor structure 300 is disposed opposite to the barrier layer 106 of the second semiconductor structure 200.

In some embodiments, the conductive plug 202 is disposed over or bonded with the bonding structure 104, such that the second semiconductor structure 200 is electrically connected with the third semiconductor structure 300. In some embodiments, the substrate 201 is electrically connected with the substrate 101 through the conductive plug 202 and the bonding structure 104. In some embodiments, the conductive plug 202 is disposed within the recess 106a over the bonding structure 104. In some embodiments, a portion of the conductive plug 202 is surrounded by the conductive layer 105 and the barrier layer 106.

In the present disclosure, a method of manufacturing a semiconductor structure is also disclosed. In some embodiments, a semiconductor structure is formed by a method 500. The method 500 includes a number of operations and the description and illustration are not deemed as a limitation as the sequence of the operations. The method 500 includes a number of operations (501, 502, 503, 504, 505, 506, 507, 508 and 509).

Figure 5:
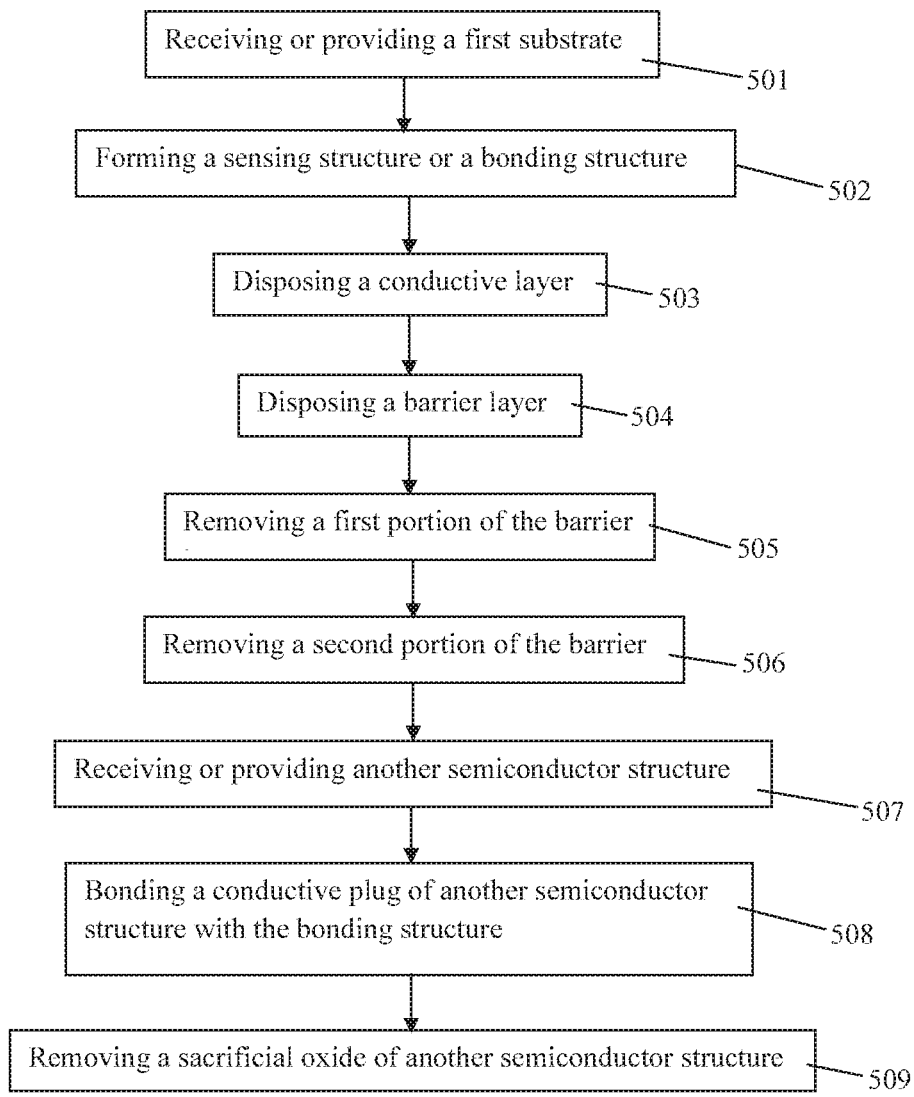
FIG. 5 is a flow diagram of a method of manufacturing a semiconductor structure in accordance with some embodiments of the present disclosure.
Figure 5A:
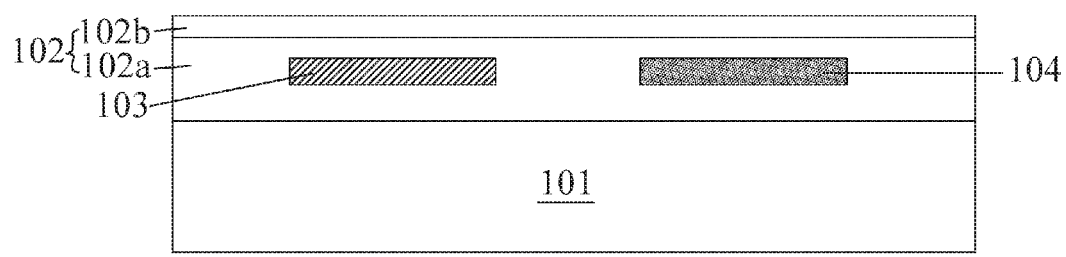
FIGS. 5A-5Q are schematic views of manufacturing a semiconductor structure by a method of FIG. 5 in accordance with some embodiments of the present disclosure.

In operation 501, a first substrate 101 is received or provided as shown in FIG. 5A. In some embodiments, the first substrate 101 is a semiconductive substrate fabricated with a predetermined functional circuit over the first substrate 101. In some embodiments, the first substrate 101 is a CMOS substrate which includes several CMOS components and CMOS circuitries thereon.

In some embodiments, a dielectric layer 102 is disposed over the first substrate 101. In some embodiments, a portion of a sensing structure 103 or a portion of a bonding structure 104 is formed and disposed within the dielectric layer 102. In some embodiments, the dielectric layer 102 includes several layers of dielectric material stacking over each other. In some embodiments, the dielectric layer 102 is an inter-layer dielectric (ILD). In some embodiments, the dielectric layer 102 includes a first dielectric layer 102a and a second dielectric layer 102b. In some embodiments, the first dielectric layer 102a includes oxide such as silicon oxide, and the second dielectric layer 102b includes nitride such as silicon nitride. In some embodiments, the dielectric layer 102 is formed by deposition, chemical vapor deposition (CVD) or any other suitable operations. In some embodiments, the portion of the sensing structure 103 or the portion of the bonding structure 104 is disposed within the first dielectric layer 102a.

Figure 5B:
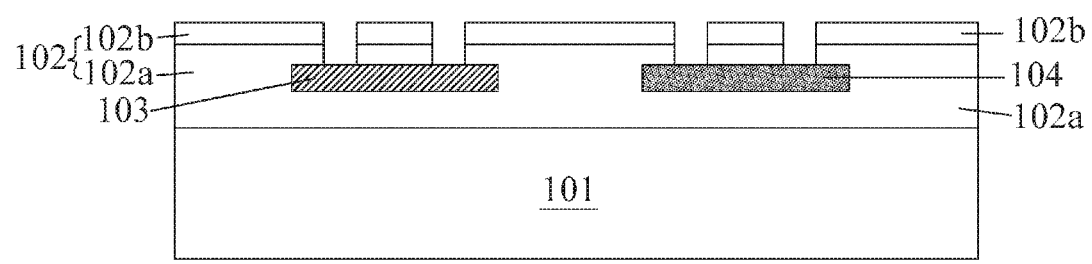
Figure 5C:
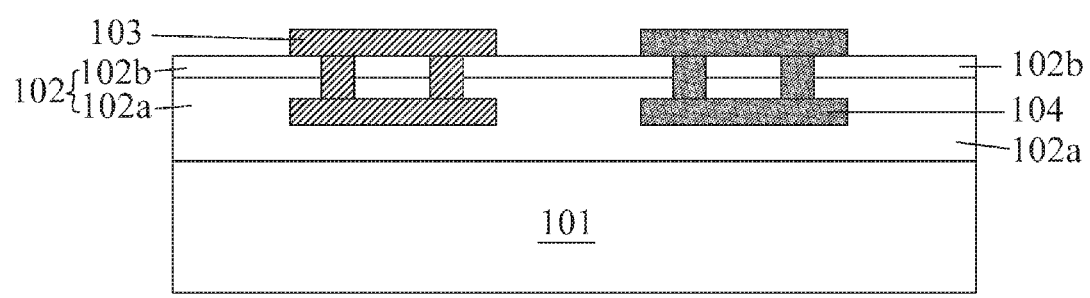

In operation 502, another portion of the sensing structure 103 or another portion of the bonding structure 104 is formed over the dielectric layer 102 as shown in FIGS. 5B and 5C. In some embodiments, some portions of the dielectric layer 102 are removed to pattern the dielectric layer 102 as shown in FIG. 5B. In some embodiments, the dielectric layer 102 is patterned by photolithography or any other suitable operations. In some embodiments, some portions of the dielectric layer 102 are removed according to the patterned dielectric layer 102 by etching or any other suitable operations, such that some of the portion of the sensing structure 103 within the dielectric layer 102 or some of the portion of the bonding structure 104 within the dielectric layer 102 are exposed from the dielectric layer 102 as shown in FIG. 5B.

After the removal of some portions of the dielectric layer 102, a conductive material such as aluminum copper (AlCu) is disposed within or over the dielectric layer 102 to form another portion of the sensing structure 103 or another portion of the bonding structure 104 as shown in FIG. 5C. In some embodiments, the conductive material is disposed by sputtering, evaporation, electroplating or any other suitable operations. In some embodiments, another portion of the sensing structure 103 is disposed over the dielectric layer 102. In some embodiments, another portion of the bonding structure 104 is disposed over the dielectric layer 102.

Figure 5D:
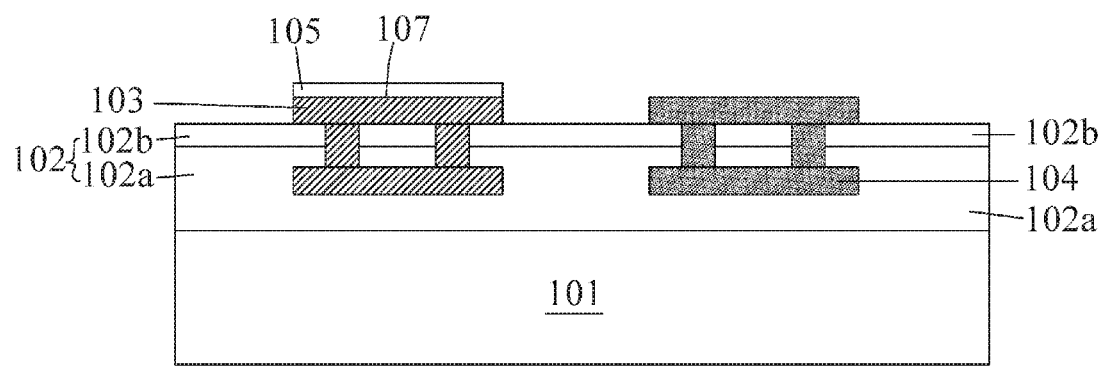
Figure 5E:
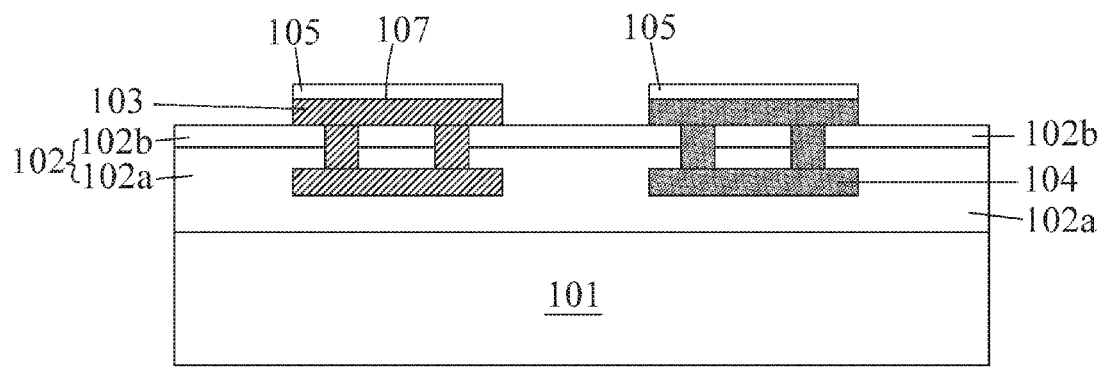

In operation 503, a conductive layer 105 is disposed over the sensing structure 103 as shown in FIG. 5D or disposed over the bonding structure 104 as shown in FIG. 5E. In some embodiments, the conductive layer 105 is disposed on the sensing structure 103. In some embodiments, the conductive layer 105 is disposed on the bonding structure 104. In some embodiments, the conductive layer 105 covers the portion of the sensing structure 103 disposed on the dielectric layer 102 or the second dielectric layer 102b. In some embodiments, the conductive layer 105 covers the portion of the bonding structure 104 disposed on the dielectric layer 102 or the second dielectric layer 102b. In some embodiments, an interface 107 is disposed between the conductive layer 105 and the sensing structure 103.

In some embodiments, the conductive layer 105 includes titanium tungsten (TiW), platinum (Pt) or gold (Au). In some embodiments, the conductive layer 105 is resistant to an etchant such as hydrofluoric acid (HF) vapor. In some embodiments, the conductive layer 105 is disposed by sputtering, electroplating or any other suitable operations. In some embodiments, the conductive layer 105 has a thickness of greater than about 0.02 um.

Figure 5F:
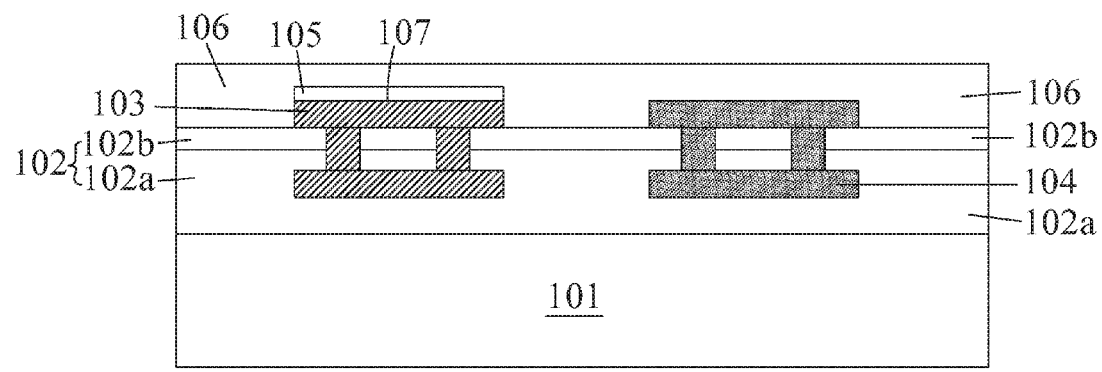
Figure 5G:
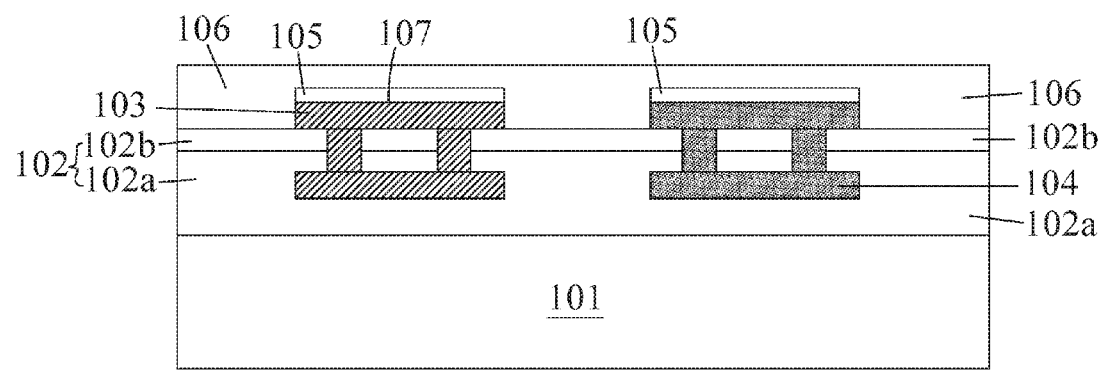

In operation 504, a barrier layer 106 is disposed over the dielectric layer 102 and the conductive layer 105 as shown in FIG. 5F or 5G. In some embodiments, the barrier layer 106 is disposed to cover the dielectric layer 102, the bonding structure 104 and the conductive layer 105 disposed on the sensing structure 103 as shown in FIG. 5F. In some embodiments, the barrier layer 106 is disposed to cover the dielectric layer 102 and the conductive layer 105 disposed on the sensing structure 103 and the bonding structure 104 as shown in FIG. 5G. In some embodiments, the barrier layer 106 includes oxide, carbide, aluminum oxide, alumina, silicon carbide or the like. In some embodiments, the barrier layer 106 is disposed by sputtering, deposition, CVD or any other suitable operations.

Figure 5H:
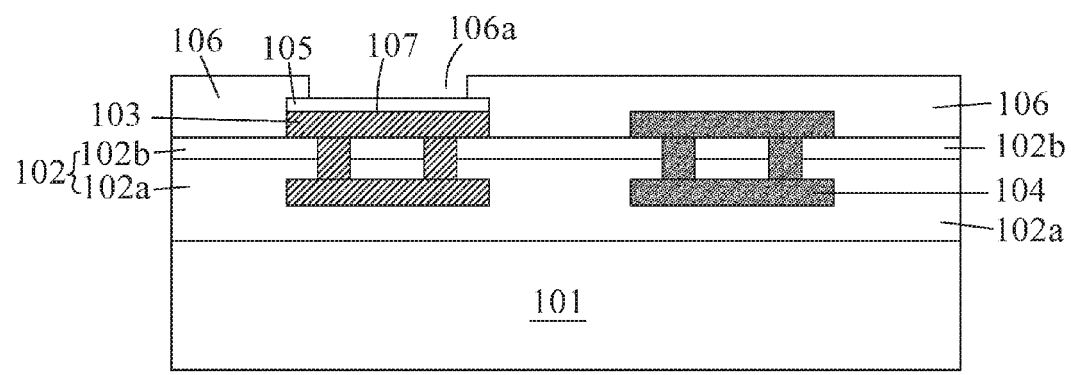
Figure 5I:
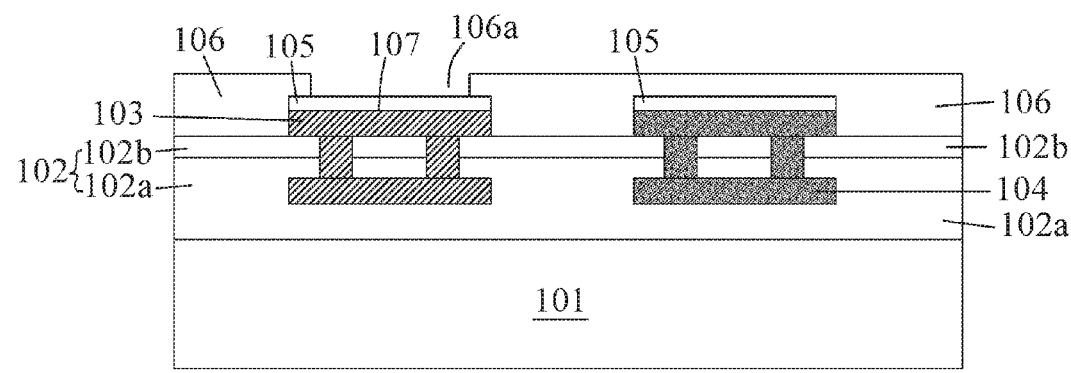

In operation 505, a first portion of the barrier layer 106 is removed to expose the conductive layer 105 on the sensing structure 103 as shown in FIG. 5H or 5I. In some embodiments, the barrier layer 106 is patterned by photolithography or any other suitable operations. In some embodiments, the first portion of the barrier layer 106 is removed by etching or any other suitable operations. In some embodiments, a recess 106a is formed after removing the first portion of the barrier layer 106, such that a portion of the conductive layer 105 on the sensing structure 103 is exposed from the barrier layer 106.

Figure 5J:
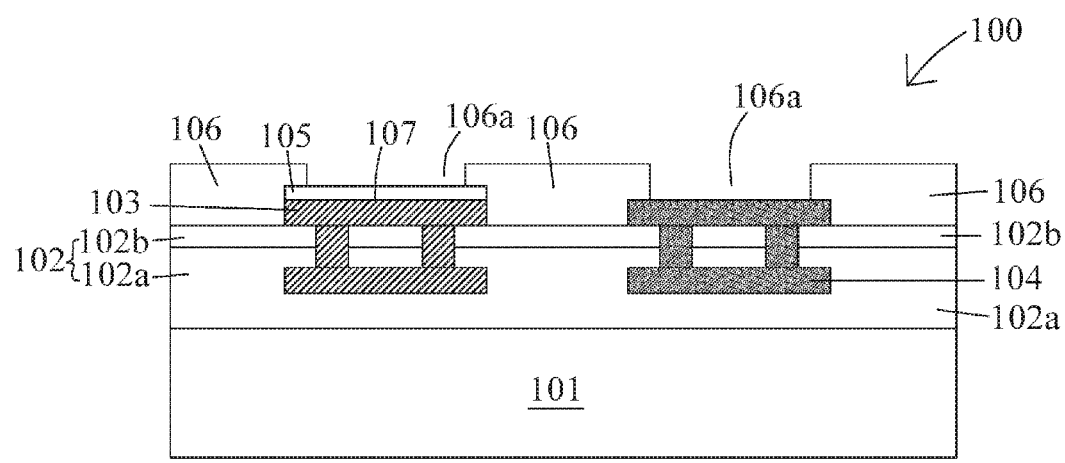
Figure 5K:
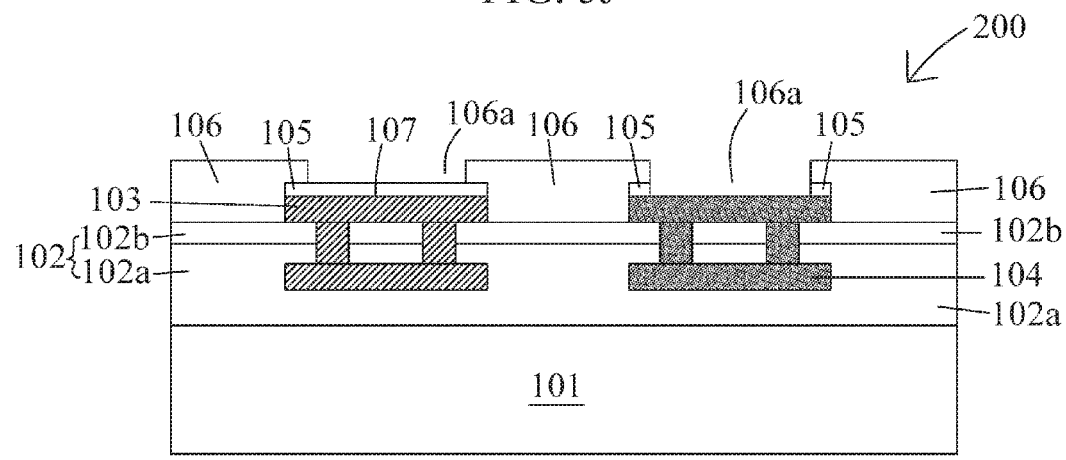

In operation 506, a second portion of the barrier layer 106 is removed as shown in FIG. 5J to expose the bonding structure 104, or a second portion of the barrier layer 106 and a portion of the conductive layer 105 on the bonding structure 104 are removed as shown in FIG. 5K to expose the bonding structure 104. In some embodiments, the barrier layer 106 is patterned by photolithography or any other suitable operations. In some embodiments, the second portion of the barrier layer 106 is removed by etching or any other suitable operations.

In some embodiments, another recess 106a is formed after removing the second portion of the barrier layer 106 as shown in FIG. 5J or 5K. In some embodiments, another recess 106a is formed by removing the second portion of the barrier layer 106 on the bonding structure 104 as shown in FIG. 5J. In some embodiments, another recess 106a is formed by removing the second portion of the barrier layer 106 and the portion of the conductive layer 105 on the bonding structure 104 as shown in FIG. 5K. As such, a portion of the bonding structure 104 is exposed from the barrier layer 106. In some embodiments, some of the conductive layer 105 is disposed on the bonding structure 104 after removing the second portion of the barrier layer 106 and the portion of the conductive layer 105 on the bonding structure 104 as shown in FIG. 5K. In some embodiments, the portion of the bonding structure 104 exposed from the barrier layer 106 is configured to receive or bond with a conductive structure.

In some embodiments, a first semiconductor structure 100 is formed as shown in FIG. 5J. The first semiconductor structure 100 has a similar configuration as the semiconductor structure 100 described above or illustrated in FIG. 1. In some embodiments, a second semiconductor structure 200 is formed as shown in FIG. 5K. The second semiconductor structure 200 has a similar configuration as the semiconductor structure 200 described above or illustrated in FIG. 2. In some embodiments, the conductive layer 105 on the sensing structure 103 is at least partially exposed from the barrier layer 106.

Figure 5L:
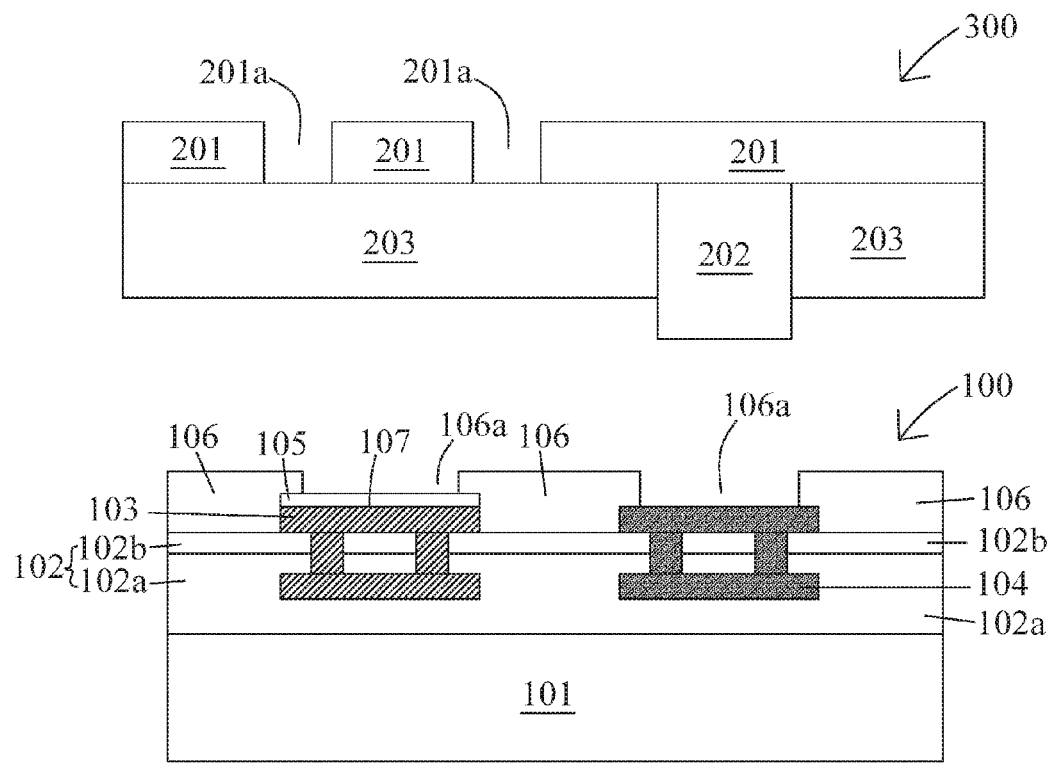
Figure 5M:
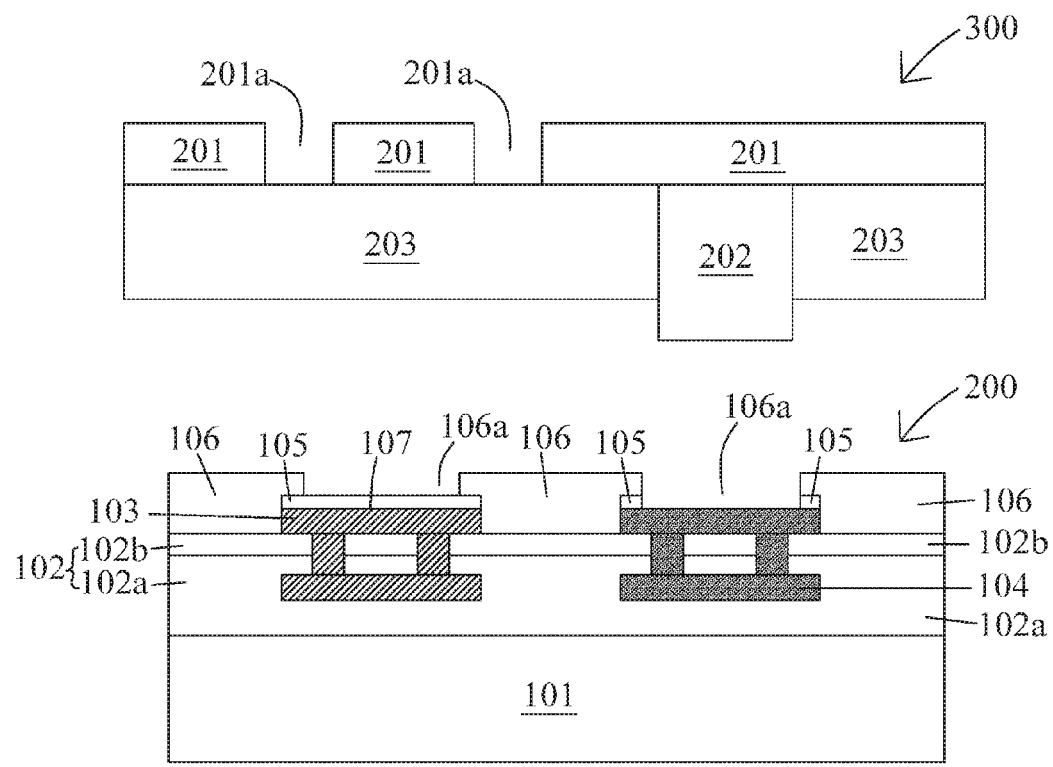

In operation 507, a third semiconductor structure 300 is received or provided as shown in FIG. 5L or 5M. In some embodiments, the third semiconductor structure 300 includes a second substrate 201, a conductive plug 202 and a sacrificial oxide 203. In some embodiments, the second substrate 201 includes several electro-mechanical elements or MEMS components disposed over the second substrate 201. In some embodiments, the second substrate 201 is a MEMS substrate. In some embodiments, the second substrate 201 includes semiconductive material such as silicon or the like. In some embodiments, the second substrate 201 is patterned to include an aperture 201a passing through the second substrate 201.

In some embodiments, the conductive plug 202 is disposed over the second substrate 201 and extended from the second substrate 201 through the sacrificial oxide 203. In some embodiments, a portion of the conductive plug 202 is protruded from the sacrificial oxide 203. In some embodiments, the conductive plug 202 includes polysilicon. In some embodiments, the sacrificial oxide 203 is disposed over the second substrate 201 and surrounds the conductive plug 202. In some embodiments, the sacrificial oxide 203 includes dielectric material such as silicon oxide.

Figure 5N:
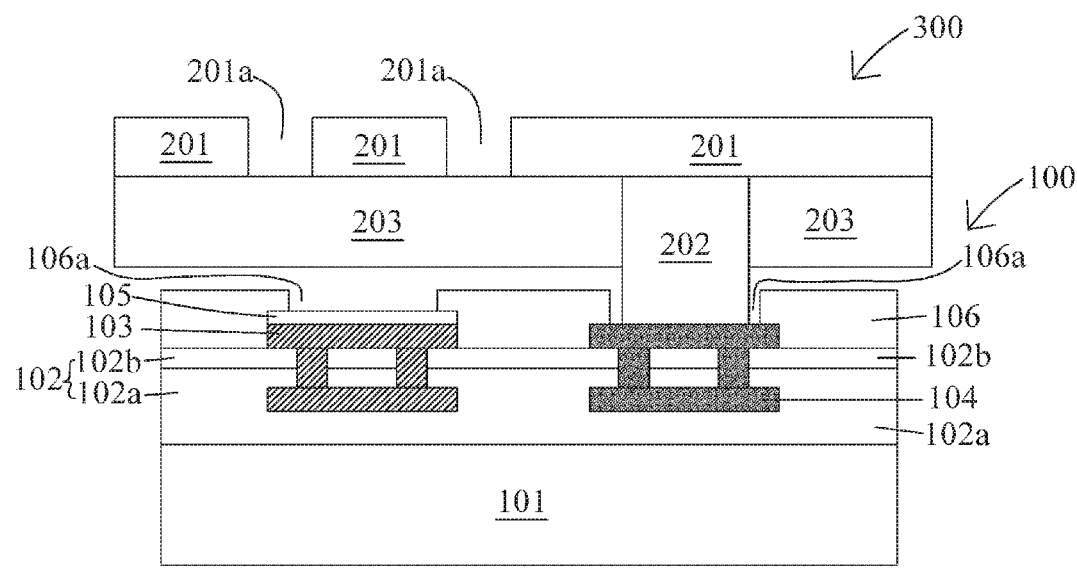
Figure 5O:
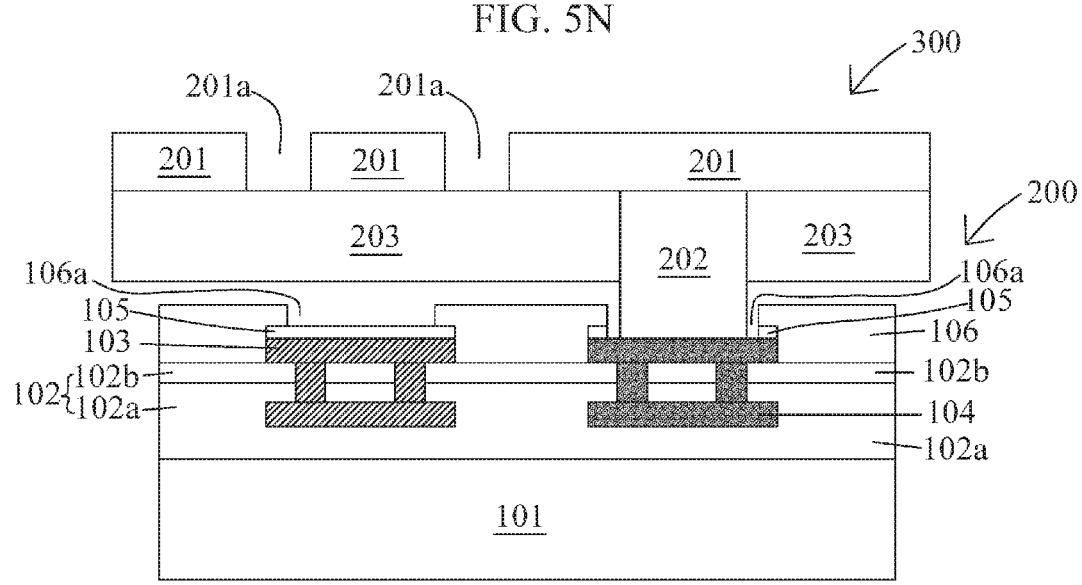

In operation 508, the conductive plug 202 is bonded with the bonding structure 104 of the first semiconductor structure 100 as shown in FIG. 5N, or bonded with the bonding structure 104 of the second semiconductor structure 200 as shown in FIG. 5O. In some embodiments, the conductive plug 202 is disposed over the bonding structure 104. In some embodiments, the conductive plug 202 and the bonding structure 104 are bonded by eutectic bonding or any other suitable operations. In some embodiments, the first semiconductor structure 100 or the second semiconductor structure 200 is disposed opposite to the third semiconductor structure 300. In some embodiments, the sacrificial oxide 203 of the third semiconductor structure 300 is disposed opposite to the barrier layer 106 of the first semiconductor structure 100 or the second semiconductor structure 200.

Figure 5P:
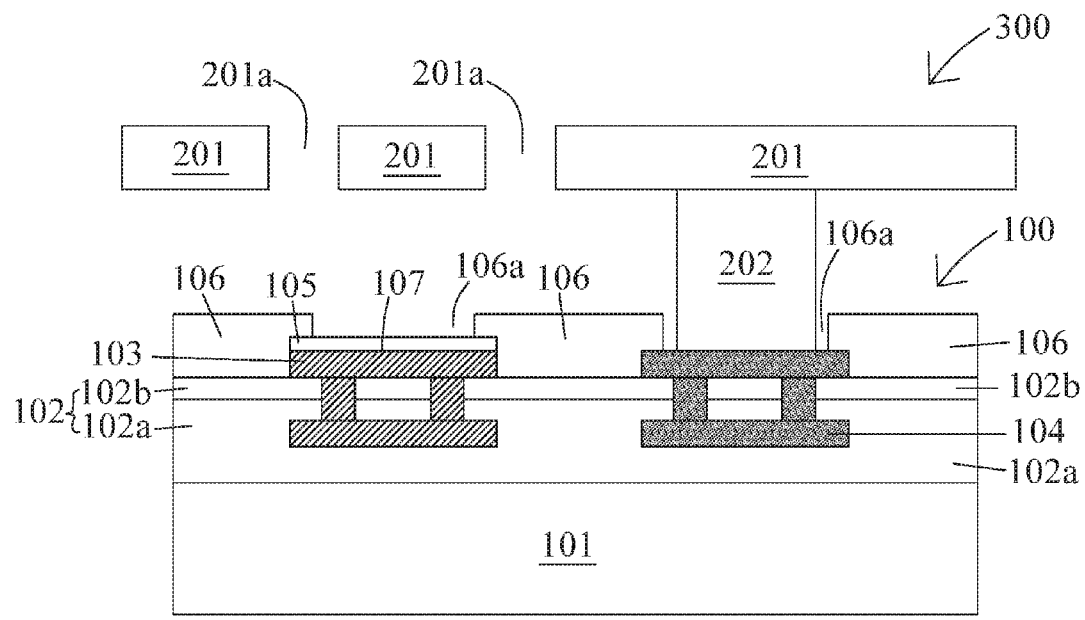
Figure 5Q:
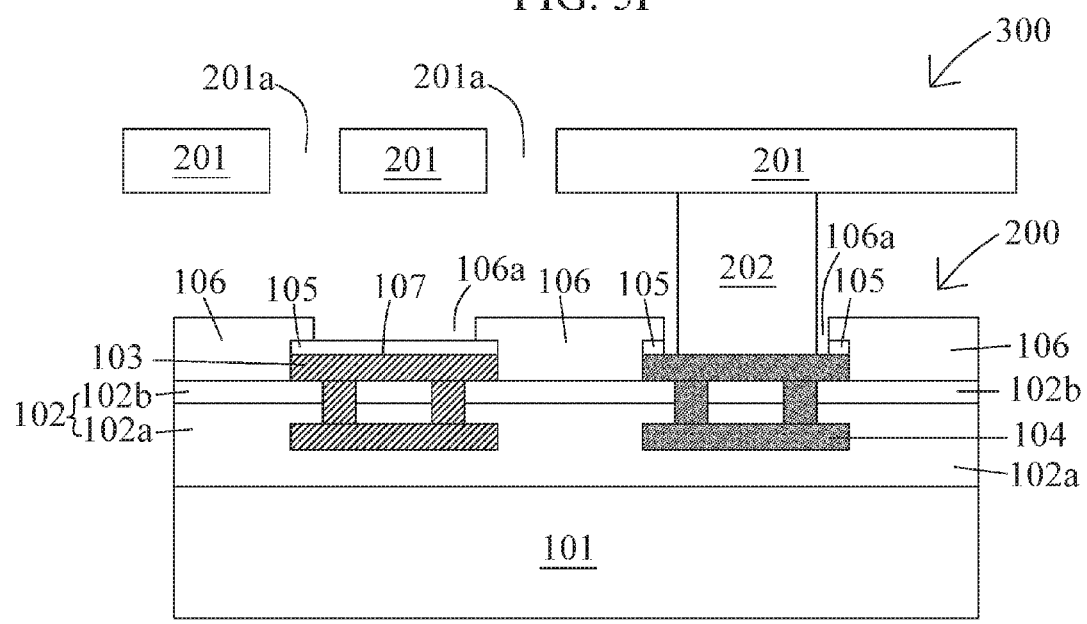

In operation 509, the sacrificial oxide 203 is removed as shown in FIG. 5P or 5Q. In some embodiments, the sacrificial oxide 203 is etched away by wet etching or any other suitable operations. In some embodiments, the sacrificial oxide 203 is removed by a predetermined etchant such as hydrofluoric (HF) acid vapor. In some embodiments, a portion of the second substrate 201 at a particular region is released and becomes sensible or displaceable to facilitate sensation after removing the sacrificial oxide 203. In some embodiments, the portion of the second substrate 201 disposed opposite to the sensing structure 103 or the conductive layer 105 exposed from the barrier layer 106 is released.

In some embodiments, the conductive layer 105 and the barrier layer 106 are resistant to the predetermined etchant. Since the sensing structure 103 and the bonding structure 104 are covered by the conductive layer 105 and the barrier layer 106, the sensing structure 103 and the bonding structure 104 would not be removed by the predetermined etchant. Only the sacrificial oxide 203 is removed. During the removal of the sacrificial oxide 203, the conductive layer 105 is at least partially exposed from the barrier layer 106. In some embodiments, a non-conductive material is absent from the conductive layer 105 exposed from the barrier layer 106 during or after removing the sacrificial oxide. As non-conductive material would not be formed on the conductive layer 105 exposed from the barrier layer 106 during or after removing the sacrificial oxide, no charging effect would be induced and thus the sensitivity of the sensing structure 103 would not be affected.

In some embodiments, a semiconductor structure including the first semiconductor structure 100 and the third semiconductor structure 300 is formed as shown in FIG. 5P. The semiconductor structure has a similar configuration as the semiconductor structure described above or illustrated in FIG. 3. In some embodiments, a semiconductor structure including the second semiconductor structure 200 and the third semiconductor structure 300 is formed as shown in FIG. 5Q. The semiconductor structure has a similar configuration as the semiconductor structure described above or illustrated in FIG. 4. In some embodiments, the conductive layer 105 on the sensing structure 103 is at least partially exposed from the barrier layer 106.

In the present disclosure, an improved semiconductor structure is disclosed. The semiconductor structure includes a conductive layer covering the sensing structure. The conductive layer includes titanium tungsten (TiW) or gold (Au). The conductive layer can prevent the sensing structure from being removed during etching operations, and non-conductive material would not be formed over the conductive layer upon or after the etching operations. Since the non-conductive material would not be formed over the sensing structure, no charging effect would be induced.

In some embodiments, a semiconductor structure includes a substrate, a dielectric layer disposed over the substrate, a sensing structure disposed over the dielectric layer, a bonding structure disposed over the dielectric layer, a conductive layer covering the sensing structure, and a barrier layer disposed over the dielectric layer and the conductive layer, wherein the conductive layer and the bonding structure are at least partially exposed from the barrier layer.

In some embodiments, the conductive layer includes titanium tungsten (TiW), platinum (Pt) or gold (Au). In some embodiments, the conductive layer is resistant to hydrofluoric (HF) acid vapor. In some embodiments, the conductive layer has a thickness of greater than about 0.01 um. In some embodiments, a non-conductive material, a dielectric material or an insulating material disposed on the conductive layer exposed from the barrier layer is absent. In some embodiments, the sensing structure and the conductive layer are surrounded by the barrier layer.

In some embodiments, the sensing structure is partially disposed within the dielectric layer. In some embodiments, the bonding structure is surrounded by the barrier layer. In some embodiments, the sensing structure and the bonding structure are conductive or include aluminum and copper. In some embodiments, the dielectric layer includes oxide, nitride, silicon oxide or silicon nitride. In some embodiments, the barrier layer includes oxide, carbide, aluminum oxide, alumina or silicon carbide. In some embodiments, the bonding structure exposed from the barrier layer is configured to receive or bond with a conductive structure.

In some embodiments, a semiconductor structure includes a CMOS substrate, a dielectric layer disposed over the first substrate, a sensing structure disposed over the dielectric layer, a bonding structure disposed over the dielectric layer, a conductive layer covering the sensing structure, a barrier layer disposed over the dielectric layer and surrounding the sensing structure and the bonding structure, a MEMS substrate disposed opposite to the barrier layer, and a conductive plug disposed over and protruded from the MEMS substrate, wherein the conductive layer is at least partially exposed from the barrier layer, and the conductive plug is bonded with the bonding structure.

In some embodiments, a portion of the conductive plug is surrounded by the conductive layer and the barrier layer. In some embodiments, the conductive plug includes polysilicon.

In some embodiments, a method of manufacturing a semiconductor structure includes receiving a first substrate including a dielectric layer disposed over the first substrate, forming a sensing structure and a bonding structure over the dielectric layer, disposing a conductive layer on the sensing structure, disposing a barrier layer over the dielectric layer, removing a first portion of the barrier layer to at least partially expose the conductive layer on the sensing structure, and removing a second portion of the barrier layer to at least partially expose the bonding structure.

In some embodiments, the disposing of the conductive layer includes sputtering or evaporation operations. In some embodiments, the method further includes receiving a second semiconductor structure including a second substrate, a sacrificial oxide disposed over the second substrate, and a conductive plug disposed over the second substrate and extending through the sacrificial oxide, eutectically bonding the conductive plug with the bonding structure, or removing the sacrificial oxide. In some embodiments, the conductive layer is at least partially exposed from the barrier layer upon the removing of the sacrificial oxide. In some embodiments, the sacrificial oxide is removed by hydrofluoric acid (HF) vapor.

In some embodiments, a method of manufacturing a semiconductor structure includes receiving a first substrate including a dielectric layer disposed over the first substrate; forming a sensing structure and a bonding structure over the dielectric layer, disposing a conductive layer on the sensing structure; disposing a barrier layer over the dielectric layer; removing a first portion of the barrier layer to at least partially expose the conductive layer on the sensing structure; and removing a second portion of the barrier layer to at least partially expose the bonding structure.

In some embodiments, the dielectric layer includes an oxide layer disposed over the first substrate and a nitride layer disposed over the oxide layer. In some embodiments, the forming of the sensing structure and the bonding structure includes removing portions of the dielectric layer and disposing a conductive material within or over the dielectric layer. In some embodiments, the method further includes disposing the conductive layer on the bonding structure. In some embodiments, the disposing of the conductive layer on the sensing structure and the disposing of the conductive layer on the bonding structure are performed simultaneously. In some embodiments, the disposing of the conductive layer includes sputtering or evaporation operations. In some embodiments, the method further includes further comprising removing a portion of the conductive layer disposed over the bonding structure to at least partially expose the bonding structure. In some embodiments, the removing of the first portion of the barrier layer is performed prior to the removing of the second portion of the barrier layer. In some embodiments, the method further includes receiving a second semiconductor structure including a second substrate, a sacrificial oxide disposed over the second substrate, and a conductive plug disposed over the second substrate and extending through the sacrificial oxide; eutectically bonding the conductive plug with the bonding structure; and removing the sacrificial oxide. In some embodiments, the conductive layer is at least partially exposed from the barrier layer upon the removing of the sacrificial oxide. In some embodiments, the sacrificial oxide is removed by hydrofluoric acid (HF) vapor.

In some embodiments, a method of manufacturing a semiconductor structure further includes receiving a substrate; disposing a first dielectric layer over the substrate; disposing a second dielectric layer over the first dielectric layer; forming a sensing structure and a bonding structure within or over the first dielectric layer and the second dielectric layer; disposing a first conductive layer on the sensing structure; disposing a second conductive layer on the bonding structure; disposing a barrier layer over the second dielectric layer and covering the first conductive layer and the second conductive layer; removing a first portion of the barrier layer to at least partially expose the first conductive layer; and removing a second portion of the barrier layer and a portion of the second conductive layer to at least partially expose the bonding structure.

In some embodiments, the bonding structure is partially exposed from the second conductive layer. In some embodiments, the disposing of the first conductive layer is performed prior to the disposing of the second conductive layer. In some embodiments, the barrier layer is resistant to hydrofluoric (HF) acid vapor. In some embodiments, the removing of the first portion of the barrier layer includes forming a first recess over the first conductive layer. In some embodiments, the removing of the second portion of the barrier layer includes forming a second recess over the bonding structure and surrounded by the second conductive layer.

In some embodiments, a method of manufacturing a semiconductor structure includes receiving a first substrate including a dielectric layer disposed over the first substrate; forming a sensing structure and a bonding structure over the dielectric layer, disposing a conductive layer on the sensing structure; disposing a barrier layer over the dielectric layer, the conductive layer and the bonding structure; and removing a portion of the barrier layer to at least partially expose the conductive layer and the bonding structure.

In some embodiments, the sensing structure is entirely covered by the conductive layer. In some embodiments, the method further includes receiving a second substrate including a conductive plug protruded from the MEMS substrate; and bonding the conductive plug with the bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor structure, comprising:
    receiving a first substrate including a dielectric layer disposed over the first substrate;
    forming a sensing structure and a bonding structure over the dielectric layer;
    disposing a conductive layer on the sensing structure;
    disposing a barrier layer over the dielectric layer;
    removing a first portion of the barrier layer to at least partially expose the conductive layer on the sensing structure; and
    removing a second portion of the barrier layer to at least partially expose the bonding structure.

2. The method of claim 1, wherein the dielectric layer includes an oxide layer disposed over the first substrate and a nitride layer disposed over the oxide layer.

3. The method of claim 1, wherein the forming of the sensing structure and the bonding structure includes removing portions of the dielectric layer and disposing a conductive material within or over the dielectric layer.

4. The method of claim 1, further comprising disposing the conductive layer on the bonding structure.

5. The method of claim 4, wherein the disposing of the conductive layer on the sensing structure and the disposing of the conductive layer on the bonding structure are performed simultaneously.

6. The method of claim 1, wherein the disposing of the conductive layer includes sputtering or evaporation operations.

7. The method of claim 1, further comprising removing a portion of the conductive layer disposed over the bonding structure to at least partially expose the bonding structure.

8. The method of claim 1, wherein the removing of the first portion of the barrier layer is performed prior to the removing of the second portion of the barrier layer.

9. The method of claim 1, further comprising:
    receiving a second semiconductor structure including a second substrate, a sacrificial oxide disposed over the second substrate, and a conductive plug disposed over the second substrate and extending through the sacrificial oxide;
    eutectically bonding the conductive plug with the bonding structure; and
    removing the sacrificial oxide.

10. The method of claim 9, wherein the conductive layer is at least partially exposed from the barrier layer upon the removing of the sacrificial oxide.

11. The method of claim 9, wherein the sacrificial oxide is removed by hydrofluoric acid (HF) vapor.

12. A method of manufacturing a semiconductor structure, comprising:
    receiving a substrate;
    disposing a first dielectric layer over the substrate;
    disposing a second dielectric layer over the first dielectric layer;
    forming a sensing structure and a bonding structure within or over the first dielectric layer and the second dielectric layer,
    disposing a first conductive layer on the sensing structure;
    disposing a second conductive layer on the bonding structure;
    disposing a barrier layer over the second dielectric layer and covering the first conductive layer and the second conductive layer;
    removing a first portion of the barrier layer to at least partially expose the first conductive layer; and
    removing a second portion of the barrier layer and a portion of the second conductive layer to at least partially expose the bonding structure.

13. The method of claim 12, wherein the bonding structure is partially exposed from the second conductive layer.

14. The method of claim 12, wherein the disposing of the first conductive layer is performed prior to the disposing of the second conductive layer.

15. The method of claim 12, wherein the barrier layer is resistant to hydrofluoric (HF) acid vapor.

16. The method of claim 12, wherein the removing of the first portion of the barrier layer includes forming a first recess over the first conductive layer.

17. The method of claim 12, wherein the removing of the second portion of the barrier layer includes forming a second recess over the bonding structure and surrounded by the second conductive layer.

18. A method of manufacturing a semiconductor structure, comprising:
    receiving a first substrate including a dielectric layer disposed over the first substrate;
    forming a sensing structure and a bonding structure over the dielectric layer;

disposing a conductive layer on the sensing structure;
disposing a barrier layer over the dielectric layer, the conductive layer and the bonding structure; and
removing a portion of the barrier layer to at least partially expose the conductive layer and the bonding structure.

19. The method of claim 18, wherein the sensing structure is entirely covered by the conductive layer.

20. The method of claim 18, further comprising:
receiving a second substrate including a conductive plug protruded from the MEMS substrate; and
bonding the conductive plug with the bonding structure.

* * * * *